United States Patent
Gammon et al.

(10) Patent No.: US 9,671,672 B1
(45) Date of Patent: Jun. 6, 2017

(54) METHOD FOR GENERATING A SINGLE PHOTON FOR QUANTUM INFORMATION PROCESSING

(71) Applicant: The United States of America, as represented by the Secretary of the Navy, Washington, DC (US)

(72) Inventors: Daniel Gammon, Waldorf, MD (US); Samuel Carter, Waldorf, MD (US); Allan S. Bracker, Alexandria, VA (US); Patrick Vora, Alexandria, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 15/463,970

(22) Filed: Mar. 20, 2017

Related U.S. Application Data

(62) Division of application No. 14/822,794, filed on Aug. 10, 2015, now Pat. No. 9,619,754.

(Continued)

(51) Int. Cl.
| | |
|---|---|
| *G02F 1/355* | (2006.01) |
| *G06N 99/00* | (2010.01) |
| *G02F 1/01* | (2006.01) |
| *G11C 13/04* | (2006.01) |
| *B82Y 20/00* | (2011.01) |
| *G02F 1/017* | (2006.01) |

(52) U.S. Cl.
CPC ......... *G02F 1/3556* (2013.01); *G02F 1/0126* (2013.01); *G06N 99/002* (2013.01); *G11C 13/047* (2013.01); *G11C 13/048* (2013.01); *B82Y 20/00* (2013.01); *G02F 2001/01791* (2013.01); *G02F 2202/32* (2013.01); *Y10S 977/774* (2013.01)

(58) Field of Classification Search
CPC ......... G02F 1/3556; G02F 2001/01791; G02F 2202/108; G06N 99/002; B82Y 20/00
See application file for complete search history.

(56) References Cited

U.S. PATENT DOCUMENTS

| | | | |
|---|---|---|---|
| 5,440,148 A * | 8/1995 | Nomoto ............... | B82Y 10/00 250/370.14 |
| 6,728,281 B1 * | 4/2004 | Santori ............... | B82Y 10/00 257/13 |

(Continued)

OTHER PUBLICATIONS

E.A. Stinaff, M. Scheibner, A.S. Bracker, I.V. Ponomarev, V.L. Korenev, M E. Ware, M.F. Doty, T.L. Reinecke, D. Gammon, "Optical signatures of coupled quantum dots," Science 311, 636 (Feb. 2006).*

(Continued)

*Primary Examiner* — Daniel Petkovsek
(74) *Attorney, Agent, or Firm* — US Naval Research Laboratory; Roy Roberts

(57) ABSTRACT

A solid-state device for generating a single photon for quantum information processing, the device including: a quantum dot molecule including: a first singly-charged quantum dot; and a second singly-charged quantum dot; wherein the first singly-charged quantum dot is adjacent to the second singly-charged quantum dot; and a tunnel barrier that separates the first singly-charged quantum dot from the second singly-charged quantum dot.

6 Claims, 8 Drawing Sheets

Related U.S. Application Data

(60) Provisional application No. 62/036,803, filed on Aug. 13, 2014.

(56) References Cited

U.S. PATENT DOCUMENTS

| | | | | |
|---|---|---|---|---|
| 7,745,816 | B2* | 6/2010 | Mohseni | H01L 27/14643 257/12 |
| 9,619,754 | B2* | 4/2017 | Gammon | G06N 99/002 |
| 2002/0179897 | A1* | 12/2002 | Eriksson | B82Y 10/00 257/14 |
| 2007/0151592 | A1* | 7/2007 | Forrest | B82Y 10/00 136/243 |
| 2010/0270534 | A1* | 10/2010 | Pioro-Ladriere | B82Y 10/00 257/14 |

OTHER PUBLICATIONS

M. Scheibner, M. Yakes, A.S. Bracker, I.V. Ponomarev, M. F. Doty, C.S. Hellberg, L. J. Whitman, T. L. Reinecke, D. Gammon, "Optically mapping the electronic structure of coupled quantum dots," Nature Physics 4, 291 (Feb. 2008).*

M. F. Doty, M. Scheibner, A. S. Bracker, I.V. Ponomarev, T. L. Reinecke, and D. Gammon, "Optical spectra of doubly charged quantum dot molecules in electric and magnetic fields," Phys Rev B 78, 115316 (Sep. 2008).*

Danny Kim, Samuel G. Carter, Alex Greilich, Allan S. Bracker, Daniel Gammon, "Ultrafast optical control of entanglement between two quantum dot spins," Nature Physics 7, 223 (Dec. 2010).*

Samuel G. Carter, Timothy M. Sweeney, Mijin Kim, Chul Soo Kim, Dmitry Solenov, Sophia E. Economou, Thomas L. Reinecke, Lily Yang, Allan S. Bracker, and Daniel Gammon, "Quantum control of a spin qubit coupled to a photonic crystal cavity," Nature Photonics 7, 329 (Mar. 2013).*

Timothy M. Sweeney, Samuel G. Carter, Allan S. Bracker, Mijin Kim, Chul Soo Kim, Lily Yang, Patrick M. Vora, Peter 3. Brereton, Erin R. Cleveland, and Daniel Gammon, "Cavity-stimulated Raman emission from a single quantum dot spin," Nature Photonics 8, 442 (May 2014).*

* cited by examiner

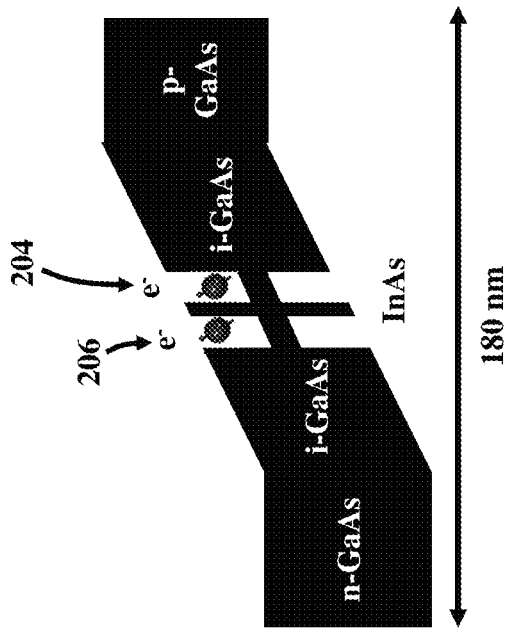
FIG. 5 C
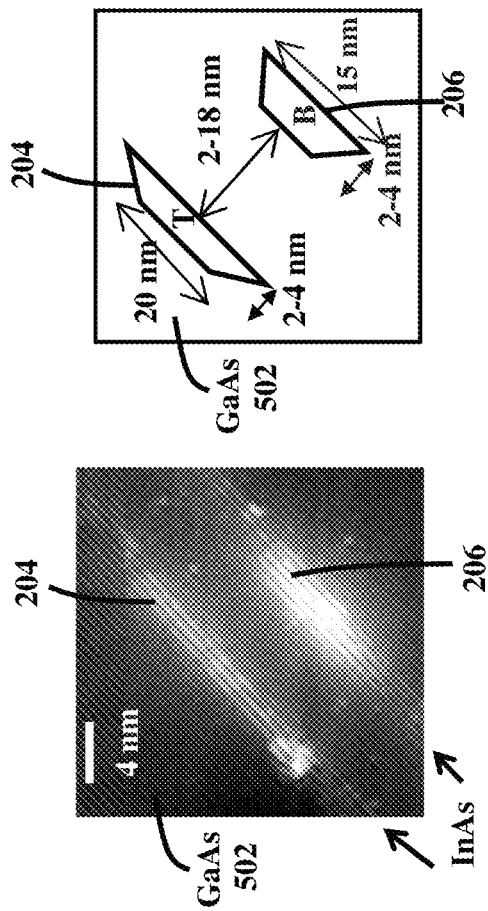
FIG. 5 B
FIG. 5 A

METHOD FOR GENERATING A SINGLE PHOTON FOR QUANTUM INFORMATION PROCESSING

GOVERNMENT INTEREST

The embodiments described herein may be manufactured, used, and/or licensed by or for the United States Government without the payment of royalties thereon.

BACKGROUND

Technical Field

The embodiments herein relate to quantum information processing, and more particularly to a photon source for quantum information processing systems.

Description of the Related Art

Single photons are the central element in quantum communication technologies such as quantum key distribution for secure communication, and also in photonic-based quantum logic technologies. Most systems currently use faint laser pulses as a photon source. The problem with this is that the laser pulses necessarily have a distribution in the number of photons in each pulse; not just one photon. If there is more than one photon in a pulse, the security in quantum communication is reduced and likewise the fidelity of the quantum logic operations is reduced.

SUMMARY

In view of the foregoing, an embodiment herein provides a solid-state device for generating a single photon for quantum information processing, the device comprising a quantum dot molecule comprising: a first singly-charged quantum dot; and a second singly-charged quantum dot adjacent to the first singly-charged quantum dot; and a tunnel barrier that separates the first singly-charged quantum dot from the second singly-charged quantum dot. The quantum dot molecule may be configured to have energy levels comprising a first energy level; a second energy level; and a third energy level, wherein the first energy level is lower than the second energy level and the second energy level is lower than the third energy level, and wherein the first energy level and the second energy level are closely spaced ground states and the third energy level is an optically excited state for the quantum dot molecule.

The quantum dot molecule may be configured to be a stationary quantum memory wherein the first energy level and the second energy level are used as a qubit bit. The quantum dot molecule may be in an optical cavity. The optical cavity may comprise any of a photonic crystal cavity, a waveguide, and a pillar etched into a semiconductor substrate. The quantum dot molecule may be configured to receive a laser beam, wherein the laser beam triggers a Raman photon. A frequency of the Raman photon may be shifted from a frequency of the laser beam by an exchange frequency, wherein a thickness of the tunnel barrier determines the exchange frequency. The solid-state device may further be configured to feed the Raman photon to a filter, the filter configured to filter the Raman photon from the laser beam. The first quantum dot and the second quantum dot may comprise indium arsenide quantum dots grown in a gallium arsenide substrate, wherein the gallium arsenide of the substrate may constitute the tunnel barrier.

Another embodiment herein provides a method for generating a single photon for quantum information processing, the method comprising triggering a Raman photon by emitting a laser to a quantum dot molecule, wherein the quantum dot molecule comprises a first singly-charged quantum dot, and a second singly-charged quantum dot adjacent to the first singly-charged quantum dot. A tunnel barrier may separate the first singly-charged quantum dot from the second singly-charged quantum dot, wherein the quantum dot molecule may be configured to have energy levels comprising: a first energy level; a second energy level; and a third energy level, wherein the first energy level is lower than the second energy level and the second energy level is lower than the third energy level, and wherein the first energy level and the second energy level are closely spaced ground states and the third energy level is an optically excited state for the quantum dot molecule.

The method may further comprise shifting a frequency of the Raman photon from a frequency of the laser beam by an exchange frequency, wherein a thickness of the tunnel barrier determines the exchange frequency. The method may further comprise filtering the Raman photon from the laser beam. The method may further comprise growing indium arsenide quantum dots in a gallium arsenide substrate to create the first quantum dot and the second quantum dot, wherein the gallium arsenide of the substrate may constitute the tunnel barrier. The method may further comprise using the first energy level and the second energy level of the quantum dot molecule as a qubit bit in a stationary quantum memory.

Another embodiment herein provides a system for generating a single photon comprising a first singly-charged quantum dot; a second singly-charged quantum dot adjacent to the first singly-charged quantum dot; and a tunnel barrier that separates the first singly-charged quantum dot from the second singly-charged quantum dot.

The system may further comprise an optical cavity for the first and second singly-charged quantum dots, wherein the optical cavity comprises any of a photonic crystal cavity, a waveguide, and a pillar etched into a semiconductor substrate. The first and second single-charged quantum dots may be configured to have energy levels comprising a first energy level; a second energy level; and a third energy level, wherein the first energy level is lower than the second energy level and the second energy level is lower than the third energy level, and wherein the first energy level and the second energy level are closely spaced ground states and the third energy level is an optically excited state for the first and second quantum dots. The system may further comprise a filter configured to filter the Raman photon from the laser beam. The first quantum dot and the second quantum dot may comprise indium arsenide quantum dots grown in a gallium arsenide substrate, wherein the gallium arsenide of the substrate may constitute the tunnel barrier.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which:

FIG. 5A is an image illustrating a quantum dot molecule made by growing InAs quantum dots in a GaAs substrate with exemplary dimensions according to an embodiment herein;

FIG. 5B is an exemplary schematic diagram of the quantum dot molecule embodiment of FIG. 5A;

FIG. 5C is a schematic diagram of a diode including two quantum dots with exemplary dimensions according to an embodiment herein;

DETAILED DESCRIPTION

Figure 1A:
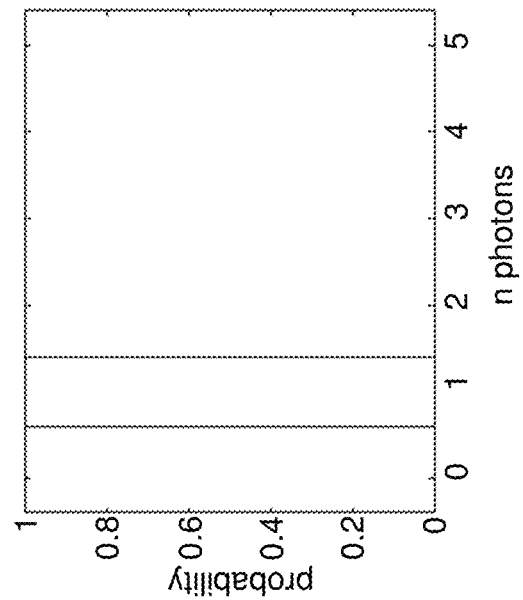
FIG. 1A is a diagram illustrating a probability distribution of number of photons in a laser pulse.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. The various dimensions and values described herein and shown in the drawings are merely examples, and the embodiments herein are not limited to the particular dimensions and values provided. Accordingly, the examples should not be construed as limiting the scope of the embodiments herein.

The embodiments herein provide a solid-state single-photon source for quantum communication and other quantum information processing technologies. Referring now to the drawings, and more particularly to FIGS. 1A through 8, where similar reference characters denote corresponding features consistently throughout the figures, there are shown preferred embodiments.

Figure 1B:
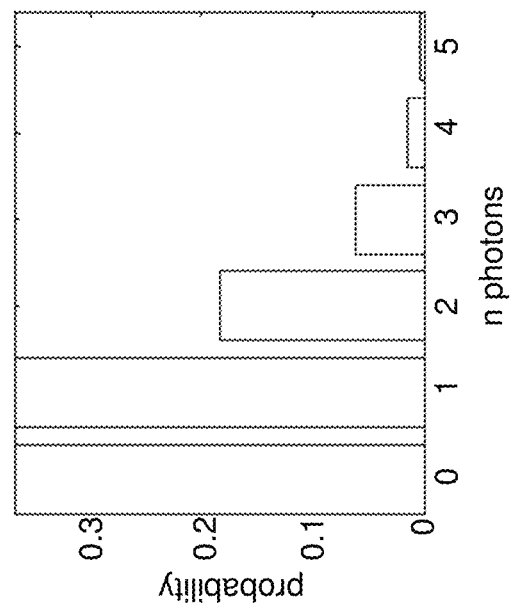
FIG. 1B is a diagram illustrating a probability distribution of number of photons in a single photon source.

In quantum information processing, it is desirable to develop a true source of single photons based on single solid-state emitters such as a semiconductor quantum dot (QD). FIG. 1A shows an example probability distribution of a number of photons in a laser pulse. A laser pulse source may generate zero or more than one photons. FIG. 1B shows a probability distribution of a number of photons in an ideal single-photon source. An ideal single photon source always generates one photon.

A single quantum dot may be incorporated into a solid state optical cavity. The optical cavity has the dual purpose of coupling the quantum dot to a single optical mode that can be efficiently emitted into a certain direction, and of enhancing the transition rate of the quantum dot, and thus, the ultimate repetition rate of single photons. A single uncharged quantum dot may be used for this purpose. The single quantum dot is often treated as a two-level system with a transition frequency equal to the optical cavity frequency. Typically, the quantum dot/cavity is excited at a laser frequency higher than the transition frequency. After energy relaxation, the quantum dot/cavity emits a single photon. Uncertainty in this relaxation time may give rise to timing jitter in the photon emission.

Figure 2:
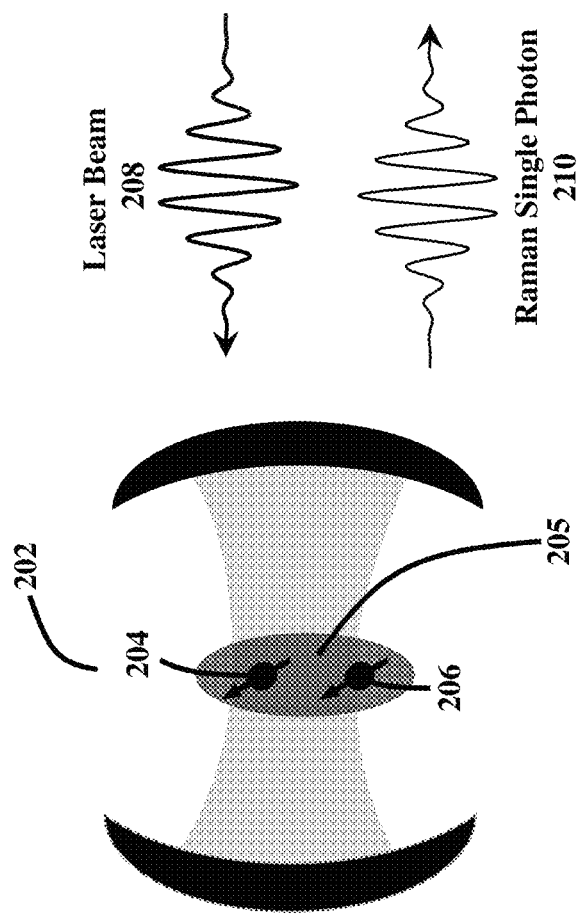
FIG. 2 is a schematic diagram illustrating two quantum dots in an optical cavity for generating a single photon according to an embodiment herein.

Instead of using a single uncharged quantum dot, the embodiments herein use two singly-charged quantum dots that are separated by a thin tunnel barrier. FIG. 2, with reference to FIGS. 1A and 1B, illustrates an embodiment using two singly-charged quantum dots 204, 206. This coupled quantum dot system is referred to herein as a quantum dot molecule 205 (QDM). The energy levels of the QDM 205 are effectively a three-level system in an optical cavity. In a three-level system, a laser beam 208 can trigger a Raman single photon 210, which is shifted from the laser beam 208. In an embodiment, the two lowest energy states could also act as a solid state qubit bit; i.e. a stationary quantum memory.

Figure 3:
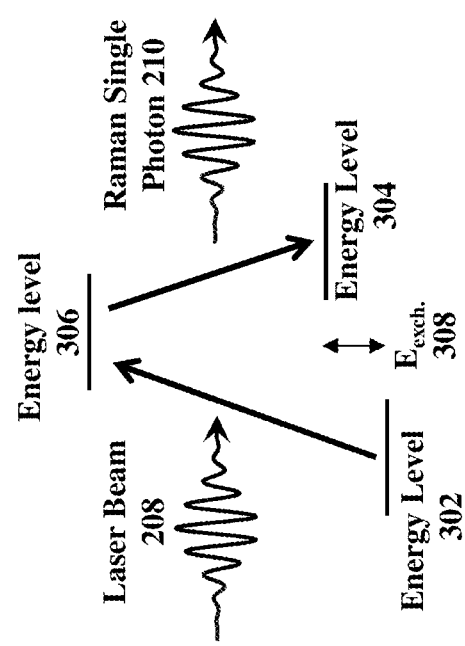
FIG. 3 is a schematic diagram illustrating exemplary three energy levels of a quantum dot molecule according to an embodiment herein.

FIG. 3, with reference to FIGS. 1A through 2, shows the three energy levels of a QDM 205. Energy level 302 is the lowest energy level or the spin-singlet state. Energy level 304 is the second lowest energy level or the spin-triplet state. Energy level 306 is the highest energy level or the optically-excited state. In the example shown in FIG. 3, laser beam 208 triggers an electron from the energy level 302 to the energy level 306. Since energy level 306 is unstable for the electron, the electron may return to energy level 304 that is closer to the ground level. As the electron returns to energy level 304, Raman single photon 210 is generated. Accordingly, laser beam 208 triggers Raman single photon 210. $E_{exch.}$ 308 is the difference between the energy level 302 and energy level 304, or the exchange energy. In an exemplary embodiment, $E_{exch.}$ is approximately 400 GHz.

Figure 4:
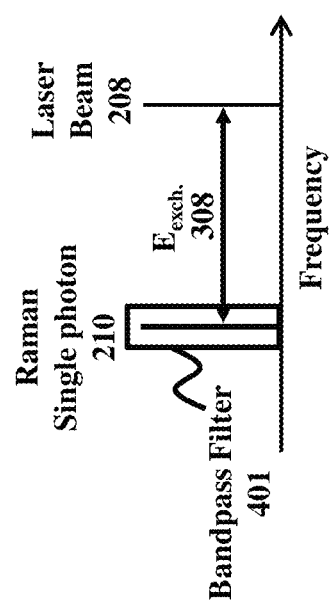
FIG. 4 is a schematic diagram illustrating exemplary frequency of a trigger laser beam and a Raman single photon according to an embodiment herein.

FIG. 4, with reference to FIGS. 1A through 3, shows a frequency shift between the laser beam 208 and the Raman single photon 210. Raman single photon 210 may be shifted from the laser beam 208 by $E_{exch.}$ 308, which is the difference between the energy level 302 and energy level 304 of the QDM 205.

In an embodiment, the QDM 205 may be manufactured using self-assembled InAs quantum dots grown in a GaAs substrate. FIGS. 5A and 5B, with reference to FIGS. 1A through 4, show example embodiments and exemplary dimensions of the QDM 205 manufactured using self-assembled InAs quantum dots 204, 206 grown in a GaAs substrate 502. The InAs/GaAs quantum dots 204, 206 may be grown in a diode such that a single electron can be injected into each quantum dot 204 or 206 at an appropriate voltage bias across the diode. FIG. 5C shows an example embodiment of a diode including two quantum dots 204, 206 with exemplary dimensions.

Coherent tunneling of the two electrons between the two quantum dots through a thin GaAs tunnel barrier leads to the formation of two closely spaced ground states known as spin-singlet and spin-triplet states. The splitting between the singlet and triplet state energies is determined by the tunneling rate. The QDM 205 can be excited and will emit through an optically excited state so that the system forms a three-level system; that is the two closely spaced ground states and the optically excited state.

Figure 6:
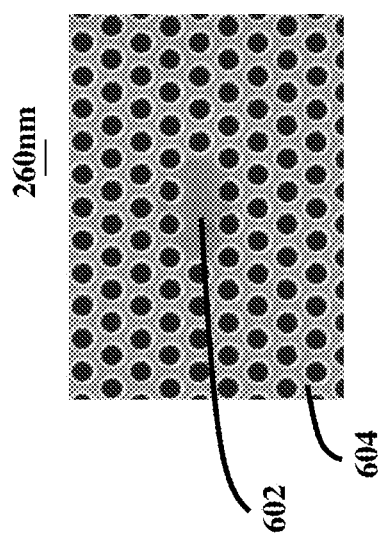
FIG. 6 is an image illustrating an optical cavity in a photonic crystal with exemplary dimensions according to an embodiment herein.

The QDM 205 can be processed into an optical cavity for efficient emission of single photons. The Raman emission process can be used to trigger a single photon. The QDM 205 may be processed into an optical cavity defined in a photonic crystal using electron-beam lithography. FIG. 6, with reference to FIGS. 1A through 5C, shows an embodiment of optical cavity 602 in photonic crystal 604 with exemplary dimensions.

Figure 7:
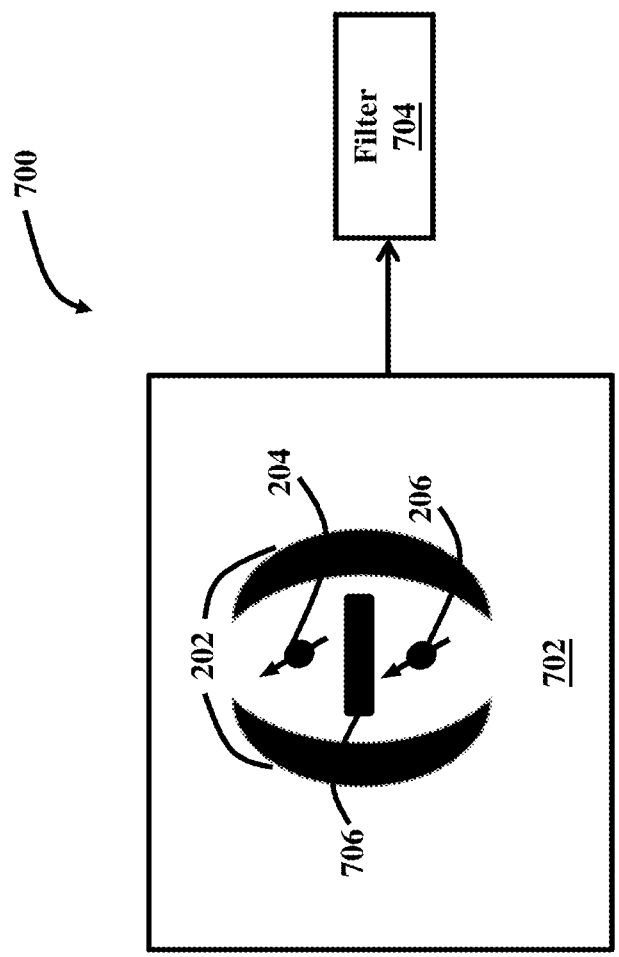
FIG. 7 is a schematic diagram illustrating a system for generating a single photon according to an embodiment herein.

FIG. 7, with reference to FIGS. 1A through 6, illustrates a system 700 for generating a single photon according to an embodiment. System 700 may include a first singly-charged quantum dot 204 and a second singly-charged quantum dot 206. The first singly-charged quantum dot 204 may be coupled to the second singly-charged quantum dot 206. A tunnel barrier 706 may separate the first singly-charged quantum dot 204 from the second singly-charged quantum dot 206. The system 700 may include an optical cavity 202 for the first and second singly-charged quantum dots 204, 206. The optical cavity 202 may be a photonic crystal cavity, a waveguide, or a pillar etched into a semiconductor substrate, for example. The first quantum dot 204 and the second quantum dot 206 may be indium arsenide quantum dots grown in a gallium arsenide substrate, for example. The gallium arsenide of the substrate may constitute the tunnel barrier 706.

The first and second single-charged quantum dots 204, 206 may be configured to have energy levels including a first energy level 302, a second energy level 304, and a third energy level 306, for example as shown in FIG. 3. The first energy level 302 may be lower than the second energy level 304 and the second energy level may lower than the third energy level 306. The first energy level 302 and the second energy level 304 are closely spaced ground states and the third energy level 306 is an optically excited state for the first and second quantum dots. The first energy level 302 and the second energy level 304 may act as a solid state qubit bit, for example in a stationary quantum memory.

System 700 may further include filter 704. Filter 704 may be configured to filter the Raman single photon 210 from the laser beam 208. In an embodiment, the filter 704 may be configured as the bandpass filter 401 shown in FIG. 4. The embodiments herein that use two singly-charged quantum dots, for example device 702 of system 700, may satisfy the basic characteristics of a single-photon source, such as:

(1) The photon is triggered by the laser beam 208.
(2) The photon efficiently emits into the cavity mode, which can be collected from the device 702 with an optical lens (not shown).
(3) The optical transition rate, and thus the single photon rate, of the quantum dot molecule in a cavity 202 can be very high.

The embodiments herein that use two singly-charged quantum dots, for example system 700, may provide that:

(1) The single photon emission 210 is triggered through the Raman process in which the frequency shift is determined by the thickness of the tunnel barrier 706. This can be quite large in order to easily filter out the laser beam 208 while still being nearly resonant with the quantum dots 204, 206 or cavity 202.
(2) The photons can be more easily made phase coherent as compared to a two-level system: the laser beam 208 is nearly degenerate with the QD/cavity and thus there is negligible timing jitter arising from uncertainty in the time required to relax to the emitting state.
(3) The single emitted photon 210 frequency is tunable by tuning the laser frequency, in contrast to a two-level system in which the photon frequency is fixed by the quantum dot frequency.
(4) The temporal lineshape of the single photon 210 follows the laser beam 208 lineshape and thus can be optimized for particular applications.
(5) The singlet/triplet states of the quantum dot molecule acts as a stationary quantum memory that can be entangled with the state of the emitted photon. In a two-level system there is no memory because the state of the quantum dot is destroyed in the emission.

The embodiments herein that use two singly-charged quantum dots 204, 206, for example device 702 of system 700 may be manufactured by fabricating a quantum dot molecule into a diode structure using the InAs/GaAs materials system, for example as shown in FIGS. 5A through C, and then patterning it into a photonic-crystal cavity, for example cavity 602 shown in FIG. 6. The embodiments herein are not limited to an InAs/GaAs semiconductor material system. The same concept could be used with other semiconductor quantum dot material systems.

In other embodiments, a single quantum dot charged with a single electron could be used instead of the QDM 205 if a large magnetic field was applied. The magnetic field would split the electron spin states into two energy levels through the Zeeman effect. With the optically excited state this also leads to a three-level system in which the Raman process could be applied.

In other embodiments, instead of an optical cavity, the quantum dot molecule could be incorporated into a waveguide. The photon would then be emitted into a waveguide mode for on-chip operations. Instead of a photonic crystal cavity or waveguide, other types of optical cavities could be used, such as a pillar etched into the semiconductor substrate.

Figure 8:
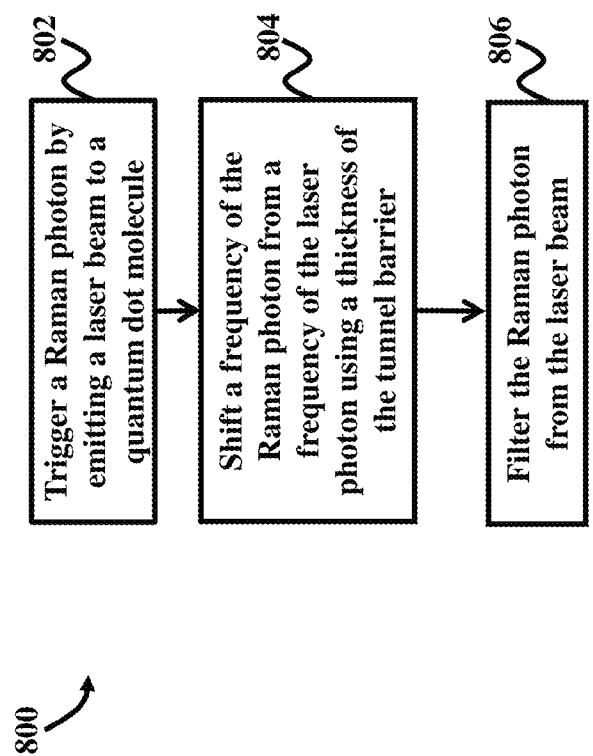
FIG. 8 is a flow diagram illustrating a method for generating a single photon according to an embodiment herein.

FIG. 8, with reference to FIGS. 1A through 7, is a flow diagram illustrating a method 800 for generating a single photon for quantum information processing according to an embodiment herein. At step 802, method 800 triggers a Raman single photon 210 by emitting a laser beam 208 to a quantum dot molecule 205. At step 804, method 800 shifts a frequency of the Raman single photon 210 from a frequency of the laser beam 208 using a thickness of the tunnel barrier 706. The frequency of the Raman single photon 210 is shifted from the frequency of the laser beam 208 by an exchange frequency. The thickness of the tunnel barrier 706 determines the exchange frequency. At step 806, method 800 filters the Raman single photon 210 from the laser beam 208.

Vora, P. et al., "Spin-cavity interactions between a quantum dot molecule and a photonic crystal cavity," *Nature Communications*, vol. 6, article number 7665, doi: 10.1038/ncomms8665, Jul. 17, 2015, incorporated herein by reference in its entirety, demonstrates that a quantum dot molecule 205 may behave as a source of single photons on demand and that there may be an enhanced emission of photons in an optical cavity 202.

Some components of the embodiments herein can include a computer program product configured to include a preconfigured set of instructions stored in non-volatile memory, which when performed, can result in actions as stated in conjunction with the methods described above. The computer program may provide for electronically controlling emission of the laser beam 208 or controlling a parameter of filter 704 according to an embodiment herein. Control functions provided by the computer program may be remotely managed according to an embodiment. In an example, the pre-configured set of instructions can be stored on a tangible non-transitory computer readable medium or a program storage device. In an example, the tangible non-transitory computer readable medium can be configured to include the set of instructions, which when performed by a device, can cause the device to perform acts similar to the ones described here.

The embodiments herein may also include tangible and/or non-transitory computer-readable storage media for carrying or having computer executable instructions or data structures stored thereon. Such non-transitory computer readable storage media can be any available media that can be accessed by a special purpose computer, including the functional design of any special purpose processor, module, or circuit as discussed above. By way of example, and not limitation, such non-transitory computer-readable media can include RAM, ROM, EEPROM, CD-ROM or other optical disk storage, magnetic disk storage or other magnetic storage devices, or any other medium which can be used to carry or store desired program code means in the form of computer executable instructions, data structures, or processor chip design. When information is transferred or provided over a network or another communications connection (either hardwired, wireless, or combination thereof) to a computer, the computer properly views the connection as a computer-readable medium. Thus, any such connection is properly termed a computer-readable medium. Combinations of the above should also be included within the scope of the computer-readable media.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. A method for generating a single photon for quantum information processing, said method comprising:
   triggering a Raman photon by emitting a laser to a quantum dot molecule in an optical cavity, wherein said quantum dot molecule comprises a first singly-charged quantum dot, and a second singly-charged quantum dot adjacent to said first singly-charged quantum dot and separated therefrom by a tunnel barrier.

2. The method of claim 1, wherein said quantum dot molecule is configured to have energy levels comprising:
   a first energy level;
   a second energy level; and
   a third energy level,
   wherein said first energy level is lower than said second energy level and said second energy level is lower than said third energy level, and
   wherein said first energy level and said second energy level are closely spaced ground states and said third energy level is an optically excited state for said quantum dot molecule.

3. The method of claim 2, further comprising shifting a frequency of said Raman photon from a frequency of said laser beam by an exchange frequency, wherein a thickness of said tunnel barrier determines said exchange frequency.

4. The method of claim 3, further comprising filtering said Raman photon from said laser beam.

5. The method of claim 4, further comprising using said first energy level and said second energy level of said quantum dot molecule as a qubit bit in a stationary quantum memory.

6. The method of claim 2, further comprising growing indium arsenide quantum dots in a gallium arsenide substrate to create said first quantum dot and said second quantum dot, wherein gallium arsenide of the substrate constitutes said tunnel barrier.

* * * * *